(12) United States Patent  
Laukart (10) Patent No.: US 11,866,818 B2  
(45) Date of Patent: Jan. 9, 2024

(54) VAPOR DEPOSITION METHOD FOR COATING A SPECTACLE LENS, PHYSICAL VAPOR DEPOSITION SYSTEM AND CRUCIBLE FOR PHYSICAL VAPOR DEPOSITION

(71) Applicant: Carl Zeiss Vision International GmbH, Aalen (DE)

(72) Inventor: Artur Laukart, Aalen (DE)

(73) Assignee: Carl Zeiss Vision International GmbH, Aalen (DE)

( * ) Notice: Subject to any disclaimer, the term of this patent is extended or adjusted under 35 U.S.C. 154(b) by 0 days.

(21) Appl. No.: 18/310,619

(22) Filed: May 2, 2023

(65) Prior Publication Data

US 2023/0265553 A1    Aug. 24, 2023

Related U.S. Application Data

(63) Continuation of application No. PCT/EP2022/054807, filed on Feb. 25, 2022.

(30) Foreign Application Priority Data

Mar. 1, 2021 (EP) .................................. 21160061

(51) Int. Cl.
*C23C 14/24* (2006.01)
*C23C 14/30* (2006.01)

(52) U.S. Cl.
CPC ............ *C23C 14/30* (2013.01); *C23C 14/243* (2013.01)

(58) Field of Classification Search
CPC ....... C23C 14/243; C23C 14/30; G02B 1/041; G02B 1/10
See application file for complete search history.

(56) References Cited

U.S. PATENT DOCUMENTS 3,655,430 A * 4/1972 Greaves .................. C23C 14/00
                                                            427/255.28
5,474,809 A   12/1995 Skelly et al.
(Continued)

FOREIGN PATENT DOCUMENTS

GB       2230792 A      10/1990
JP      H01275747 A     11/1989
(Continued)

OTHER PUBLICATIONS

Industrial Norm "Ophthalmic optics—Spectacle lenses—Vocabulary (ISO 13666:2019)," English version EN ISO ISO 13666:2019, Dec. 2019.

(Continued)

*Primary Examiner* — Elizabeth A Burkhart
(74) *Attorney, Agent, or Firm* — Tautz & Schuhmacher LLC; Georg M. Hasselmann (57) ABSTRACT

A coating of spectacle lenses is applied by physical vapor deposition (PVD). A method for physical vapor deposition includes: providing a crucible containing a first evaporation material and a second evaporation material, wherein the first evaporation material has a first vapor pressure and the second evaporation material has a second vapor pressure different from the first vapor pressure. A ratio of an exposed surface of the first evaporation material and an exposed surface of the second evaporation material in the crucible is adapted to counterbalance the difference in vapor pressure between the first and the second evaporation material. Concurrent evaporation of the first evaporation material and the second evaporation material from the same crucible take place. The disclosure further relates to a crucible for physical vapor deposition and a physical vapor deposition system in particular for coating an optical surface such as a spectacle lens.

12 Claims, 4 Drawing Sheets

(56) References Cited

U.S. PATENT DOCUMENTS

| | | | |
|---|---|---|---|
| 5,773,078 A | 6/1998 | Skelly | |
| 7,329,436 B2* | 2/2008 | Belousov | C23C 14/30 427/250 |
| 2003/0047139 A1* | 3/2003 | Corderman | C23C 14/16 118/723 VE |
| 2003/0077403 A1 | 4/2003 | Darolia et al. | |
| 2013/0129938 A1* | 5/2013 | Hass | C23C 14/10 427/569 |
| 2016/0326628 A1* | 11/2016 | DePalma | C23C 14/228 |

FOREIGN PATENT DOCUMENTS

| | | |
|---|---|---|
| JP | 2004191062 A | 7/2004 |
| WO | 2011085109 A1 | 7/2011 |

OTHER PUBLICATIONS

European Search Report issued in EP 21160061.4, to which this application claims priority, dated Sep. 23, 2021.
International Search Report and Written Opinion issued in PCT/EP2022/054807, to which this application claims priority, dated May 30, 2022.

* cited by examiner

Related art

VAPOR DEPOSITION METHOD FOR COATING A SPECTACLE LENS, PHYSICAL VAPOR DEPOSITION SYSTEM AND CRUCIBLE FOR PHYSICAL VAPOR DEPOSITION

CROSS REFERENCE TO RELATED APPLICATIONS

This application is a continuation application of international patent application PCT/EP2022/054807, filed on Feb. 25, 2022 and designating the U.S., which claims priority to European patent application EP 21 160 061.4, filed on Mar. 1, 2021, both of which are hereby incorporated by reference in their entireties.

TECHNICAL FIELD

The present disclosure relates to the coating of spectacle lenses. More generally, the present disclosure relates to the field of physical vapor deposition (PVD). PVD is widely used for coating optical surfaces such as a spectacle lens. In particular, the present disclosure relates to method for physical vapor deposition, a crucible for physical vapor deposition and a vapor deposition system.

BACKGROUND

Physical vapor deposition (PVD), sometimes also referred to as physical vapor transport (PVT), is a vacuum deposition method, which can be used to produce thin films and coatings on surfaces. In PVD, the material goes from a condensed phase to a vapor phase and then back to a thin film condensed phase. An advantageous application scenario is the coating of optical surfaces such as spectacle lenses.

A coating may be applied to the optical surface, for example, to provide an anti-reflection coating or to achieve specific filter characteristics such as filtering undesirable blue light or infrared (IR) components. High-performance lens coatings can make glasses extremely durable against scratches or adhesive dirt. As a benefit, the lenses may remain dirt-free for longer, making them significantly easier to clean.

Modern light sources and displays emit a disproportionately high amount of blue light. While the human body requires a certain amount of blue light to control the sleep/wake cycle, too much of the 'wrong' kind of blue light may pose a health risk and may cause eye diseases. Lenses with a tailored lens coating, such as the ZEISS Dura-Vision BlueProtect of the applicant, feature a special filter, which may help to provide comfortable vision even when there is a high blue light portion.

In certain applications, it may be desirable to provide a coating comprising different material components or constituents. Different material components can be evaporated in parallel from different evaporation sources. Each evaporation source comprises a crucible with one material component that can be heated separately to a temperature required to achieve a composition for the coating.

GB 2 230 792 A discloses an apparatus and method for use in a physical vapor deposition process for the production of alloys. It is suggested to provide at least two separate evaporation sources with individual temperature control for different evaporation materials.

The method described in GB 2 230 792 A comprises evaporating constituents from at least two evaporators maintained at independent temperatures, causing the constituent vapors to flow into a vessel defining there within a vapor mixing chamber, heating the vessel walls in the part thereof delimiting the vapor mixing chamber to a temperature at least as high as the hotter or hottest evaporator thereby enhancing mixing of the respective constituent vapors by vapor reflection whilst suppressing condensation of vapor on the chamber walls, and causing the mixed vapors to pass through a discharge opening in the vessel and impinge on a temperature controlled collector.

WO 2011/085109 A1 relates to the coating of turbine engines. A method for the co-evaporation and deposition of materials with differing vapor pressures is disclosed. It is suggested to use a multi-source evaporation process wherein two closely neighboring crucibles having elements of a first and of a second material are co-evaporated by applying an electron beam. The two closely neighboring crucibles are also referred to as dual crucible. The electron beam is used at a first power for evaporating the first material having a first vapor pressure for depositing the first material onto a substrate. The electron beam is used at a second power for evaporating the second material having a second vapor pressure for depositing the second material onto the substrate. The proposed deposition method shall improve the direct vapor deposition process by enabling the vapor deposition from multiple evaporate sources to form new compositions of deposition layers over larger and broader substrate surface areas.

JP H01 275747 A describes the manufacture of a thin metallic film. A controlled electron beam from a secondary electron beam source is deflected to selectively heat a primary vapor-depositing material and a secondary vapor-depositing material with different concentrations of high vapor pressure components.

However, the inventor recognized that a drawback of the aforementioned methods is that they are rather complex and require substantial modifications of existing vacuum deposition equipment.

SUMMARY

It is an object of the present disclosure to provide an improved system and method for physical vapor deposition. In particular, it would be advantageous to reduce the cost for providing complex coatings and/or to provide high quality coatings with limited effort. It would also be advantageous to enable retrofitting existing physical vapor deposition systems, in particular without requiring substantial modification of existing vacuum deposition equipment.

To better address one or more of these concerns, according to a first aspect of the disclosure, a method for physical vapor deposition, in particular for coating an optical surface such as a spectacle lens, is provided. The method comprises providing a crucible comprising a first evaporation material and a second evaporation material, wherein the first evaporation material has a first vapor pressure and the second evaporation material has a second vapor pressure different from the first vapor pressure, wherein a ratio of the first evaporation material and the second evaporation material in the crucible is adapted to counterbalance the difference in vapor pressure between the first and the second evaporation material, and concurrent evaporation of the first evaporation material and the second evaporation material from the same crucible. More precisely, a ratio of an exposed surface of the first evaporation material and an exposed surface of the second evaporation material at a surface of the crucible can be adapted to counterbalance the difference in vapor pressure between the first and the second evaporation material.

According to a further aspect, a crucible for physical vapor deposition is provided, in particular for coating an optical surface such as a spectacle lens, the crucible comprising a first evaporation material and a second evaporation material, wherein the first evaporation material has a first vapor pressure and the second evaporation material has a second vapor pressure different from the first vapor pressure, wherein a ratio of the first evaporation material and the second evaporation material in the crucible is adapted to counterbalance the difference in vapor pressure between the first and the second evaporation material. More precisely, a ratio of an exposed surface of the first evaporation material and an exposed surface of the second evaporation material at a surface of the crucible can be adapted to counterbalance the difference in vapor pressure between the first and the second evaporation material.

According to yet another aspect, a physical vapor deposition system is provided, in particular for coating an optical surface such as a spectacle lens, the system comprising: a vacuum chamber; a crucible as described above; and an evaporation unit adapted to concurrently evaporate the first evaporation material and the second evaporation material from the same crucible.

The inventors recognized that existing vacuum deposition system often only have a single heating source or evaporation unit and are used for evaporating a single evaporation material from a single crucible at a time. Different crucibles with different evaporation materials may be subsequently provided to the evaporation unit, e.g., to deposit a layer sequence such as a dielectric anti-reflection coating onto an optical surface. More complex vacuum deposition systems may comprise a plurality of heating sources or evaporation units in parallel, each having a separate crucible. Since the evaporation materials may have different vapor pressures, the different evaporation units are controlled individually and use different electron beam powers to achieve a desired deposition rate. However, the construction and control is complex.

The basic idea of the disclosure is to specifically adapt the composition of the content of a single individual crucible such that evaporation of the first and second evaporation material from the crucible provides a desired coating composition on a surface to be coated. Instead of adapting an electron beam power to compensate for the different vapor pressures of the first and second evaporation materials in different crucibles, it is suggested that the composition of the content of a single individual crucible is modified. A ratio of the first evaporation material and the second evaporation material in the crucible is adapted to counterbalance the difference in vapor pressure between the first and the second evaporation material. Hence, even though the first and second evaporation material have different vapor pressures, a desired stoichiometry or stoichiometric ratio can be achieved such that a desired composition of the coating can be achieved. Hence, it is not necessary to evaporate the first and second evaporation material with different heating or electron or laser beam power. This simplifies the control. Moreover, existing vapor deposition equipment can be used without substantial modification, neither for the arrangement of crucibles nor for adapting control and/or beam steering of an evaporation unit.

Exemplary embodiments of the disclosure are defined below. It shall be understood that the disclosed crucible and physical vapor deposition system can have similar and/or identical refinements or exemplary embodiments as the disclosed method for physical vapor deposition, as disclosed herein.

It shall be understood that optionally three or more evaporation materials may be used, depending on a desired composition of the coating. The third evaporation material may have yet another third vapor pressure different from the first and/or second vapor pressure. The ratio of the first, second, and third evaporation material may be adapted accordingly to counterbalance the difference in vapor pressure between the first, second, and third evaporation material. The same considerations apply if further evaporation materials are used.

In the following, some terms which are used throughout the application, shall be shortly explained and defined:

The term vapor pressure (equilibrium or saturation vapor pressure) as used herein may refer to a pressure exerted by a vapor in thermodynamic equilibrium with its condensed phases (solid or liquid) at a given temperature in a closed system. The equilibrium vapor pressure is an indication of a liquid's evaporation rate. It relates to the tendency of particles to escape from the liquid or solid. The first and second evaporation material are usually provided in solid form and evaporated by an evaporation unit. The term evaporation material thus denotes a material to be evaporated. An evaporation unit can be a heating source, in particular using an electron or laser beam to evaporate (sublimate) the first and second evaporation material.

The term crucible as used herein may refer to an exchangeable receptacle for the evaporation material. It refers to an individual single crucible, i.e., not a dual crucible with two closely neighboring crucibles. The crucible can be placed into a crucible holder in a vacuum chamber of the physical vapor deposition system. The first and second evaporation material are evaporated out of the same single crucible by applying heat to the evaporation material in particular using an electron or laser beam.

As used herein, a ratio of the first and second evaporation material in the crucible may refer to a ratio of the concentrations of the first and second evaporation material in the crucible. It shall be understood that there are different ways to express the concentration of a component such that there are also different ways to express the composition of a mixture. The ratio may be expressed as molar fraction, volume fraction, mass fraction, and the like. The underlying teaching is that the ratio of the first and second evaporation material in the crucible is adapted to counterbalance the difference in vapor pressure of the first and second evaporation material. For example, the first evaporation material may be Ag and the second evaporation material may be $SiO_2$ and a desired coating shall comprise similar amounts of Ag and $SiO_2$. If a 1:1 ratio of Ag and $SiO_2$ were to be provided at a temperature of e.g., 1000° C. this would mean a low vapor pressure about $10^{-3}$ to $10^{-2}$ Pa (unit of pressure Pascal) for $SiO_2$ and a high vapor pressure of about 1 Pa for Ag. Hence, if Ag and $SiO_2$ were to be evaporated from the same single crucible (without adapting the electron beam power for the different evaporation materials) this would mean that about 100 to 1000 times the amount of Ag would be deposited compared to $SiO_2$. Hence, in the given exemplary embodiment the difference in vapor pressure may be counterbalanced or compensated by providing 100 to 1000 times the amount to $SiO_2$ in the crucible. It shall be understood that the ratio of the first evaporation material and the second evaporation material in the crucible may also be adapted to provide a desired mixing ratio the first and the second evaporation material in the coating to be deposited, in addition to being adapted to counterbalance the different in vapor pressure between the first and the second evaporation material.

Unless otherwise indicated, the terminology used in the context of the present application corresponds to the definitions in the standard ISO 13666:2019(E).

In a refinement of the method for physical vapor deposition, a ratio of an exposed surface of the first evaporation material and an exposed surface of the second evaporation material at a surface of the crucible is adapted to counterbalance the difference in vapor pressure between the first and the second evaporation material. In other words, the ratio of the first evaporation material and the second evaporation material in the crucible may refer to a surface ratio of the first and second evaporation material. It should be noted that the surface ratio may be varied intentionally as the first and second evaporation material are evaporated during the vapor deposition process. This allows to carefully adjust the composition of the coating to be deposited. An advantage is that no complex control strategy and no separate crucibles for different materials are required.

The ratio of the exposed surfaces of the first and second evaporation material may be inversely proportional to a ratio of vapor pressures of the first and second evaporation materials. In other words, as used herein inversely proportional means that for an evaporation material that evaporates more easily (e.g., at lower temperatures or with higher vapor pressure) a smaller exposed surface is provided and for an evaporation material that evaporates less easily (e.g., at higher temperatures or lower vapor pressure) a larger exposed surface is provided, thereby counterbalancing the difference in vapor pressure between the first and the second evaporation material. It shall be understood that an additional factor may be considered to account for a desired ratio of the first and second evaporation material. For example, if a 2:1 ratio of Ag and SiO2 where to be provided the ratio of the exposed surfaces may also be proportional to the desired ratio of the first and second material to be deposited and inversely proportional to the ratio of the vapor pressures of the first and the second evaporation materials. Hence, the control of an electron or beam for evaporation of the first and second evaporation material may be simplified. Instead of adapting the control for a heating source, the configuration of the content of the first and second evaporation material is adapted.

As indicated above, the first evaporation material and the second evaporation material may be evaporated using an electron beam or laser beam. Advantageously, the electron beam or laser beam may be set to the same power for evaporation of the first and second material. An advantage is that the control may be simplified. For example, legacy systems may be used without having to modify a beam power. The beam may simply scan over the entire crucible without modification. An existing control may be used. Advantages may include easy retrofitting.

The first evaporation material may have a higher vapor pressure than the second evaporation material. In particular, the first vapor pressure of the first evaporation material may be at least one of at least 5 times, at least 10 times, at least 50 times or at least 100 times the second vapor pressure of the second evaporation material. Hence, the proposed solution may advantageously be used also for strongly differing vapor pressures. This is rather surprising, since conventional systems used different crucibles for materials with differing vapor pressures, in particular for strongly differing vapor pressures.

In an embodiment, the first evaporation material having a higher vapor pressure may be provided as a solid body, and the second evaporation material having a lower vapor pressure than the first evaporation material may be provided as a granulate surrounding the solid body of the first evaporation material. The inventors recognized that this specific arrangement may provide further improved coating quality, in particular a high homogeneity of a coating to be deposited. Should the solid body start to evaporate underneath a surface level of the content of the crucible, the granulate slows down the (direct) evaporation of the solid body thanks to its large granulate surface. Hence, a certain degree of self-balancing of the evaporation of the higher evaporation pressure solid body and the lower evaporation pressure granulate is achieved.

The higher evaporation pressure material being provided as a solid body surrounded by a granulate of the lower evaporation pressure material may provide advantageous heat transfer between first and second evaporation material. A possible explanation is that the solid body of the first evaporation material facilitates heat transfer into lower layers, away from a surface where an electron or laser beam heats the material, and thereby slows evaporation of the first evaporation material having higher vacuum pressure; whereas the granulate of the second evaporation material reduces heat transfer such that sufficient evaporation of the second evaporation material is achieved. As used herein the term surrounding may be understood as at least partially surrounding, i.e., not necessarily surrounding at all sides. As used herein a granulate comprises or consists of a plurality of grains having a maximum grain size (maximum grain diameter) of no more than 8 mm, in particular of no more than 5 mm, in particular of no more than 3 mm, in particular of no more than 1 mm. The term granulate may also refer to a powder as a fine granulate. At least one extension of the solid body of the first evaporation material is at least twice, in particular at least 3 times, in particular at least 4 times, in particular at least 6 times, in particular at least 10 times the maximum grain size (maximum gain diameter) of the granulate of the second evaporation material.

The solid body of the first evaporation material may have at least 10 times, in particular at least 100 times, in particular 1000 times the mass or volume of any individual part of the granulate of the second evaporation material. A top part of the solid body of the first evaporation material is accessible for evaporation with an electron or laser beam; and a top part of the granulate of the second evaporation material is accessible for evaporation with an electron or laser beam. The respective (effective) surfaces of the first and second evaporation material that are accessible or exposed for evaporation can thus provide the ratio of the first evaporation material and the second evaporation material adapted to counterbalance the difference in vapor pressure between the first and the second evaporation material.

In a refinement, the first evaporation material can be provided as at least one of a rod, a wire or sheet. In particular, the solid body of the first evaporation material may stand upright in the granulate of the second evaporation material. The solid body may be provided e.g., as a rod, wire or sheet that may extend in a height direction of the crucible. Height direction can refer to a direction parallel to gravity when the crucible is placed in an evaporation position in the vacuum chamber.

Optionally, a plurality of rods, wires or sheets of the first evaporation material are provided. It has been found that several smaller rods or wires may provide better performance and homogeneity of coating than one thick rod, wire or sheet. Direct sublimation is facilitated and the risk that large drops of material may be formed that may run sideways into lower layers of the granulate can be reduced. For example, a plurality of thinner wires, e.g., having a diameter of not more than 0.2 mm, may be used instead of one thicker wire, e.g., having a diameter of at least 0.5 mm. The combination of the thinner wires having the same cross-sectional area as the thicker wire. Similarly, a thin sheet or foil as the solid body may provide better performance than a thick wire or rod. Generally, a geometry of the solid body may be adapted to inhibit the formation of drops, e.g., a geometry that allows direct sublimation or only results in very small droplets instead large drops that may prevent heat conduction into the depth.

The solid body may be arranged in the crucible without touching a bottom of the crucible. For example, the solid body may stand upright in the granulate of the second evaporation material. There may be a bottom layer of the granulate of the second evaporation material underneath the solid body of the first evaporation material. An advantage of the solid body not touching the bottom of the crucible can be that an undesired current path to the bottom of the crucible can be avoided when using electron beam heating. This may reduce undue localization of the first evaporation material and thus allows to improve the quality of the evaporation process and thus of the coating.

A cross-sectional area of the solid body may vary in a direction perpendicular to a height-direction of the crucible. Thereby, a ratio of an exposed surface of the first evaporation material and an exposed surface of the second evaporation material at a surface of the crucible varies as the first and second evaporation material are evaporated. Hence, varying concentration profiles can be generated over the thickness of a coating to be deposited on a target in an easy matter. No depth-dependent adaptation of the electron or laser beam power for the evaporation processes or careful adjustment of beam powers for different crucibles may be required. Hence, the deposition of complex coating profiles can be simplified. A height direction may again refer to a direction of gravity.

The first evaporation material and the second evaporation material having a lower vapor pressure than the first evaporation material may optionally be provided as a granulate mixture in the crucible. A ratio of the first evaporation material and the second evaporation material in the granulate mixture in the crucible can be adapted to counterbalance the difference in vapor pressure between the first and the second evaporation material. Hence, a granulate mixture may be provided as an alternative solution. For example, a different volume percentage of the first and the second evaporation material can be used. For example, a granulate mixture comprising 0.1 . . . 1 at % Ag in $SiO_2$ can counterbalance or compensate for the difference in vapor pressure.

The first evaporation material and the second evaporation material having a lower vapor pressure than the first evaporation material may optionally be provided as a tablet in the crucible. A ratio of the first evaporation material and the second evaporation material in the tablet can be adapted to counterbalance the difference in vapor pressure between the first and the second evaporation material. A tablet as used herein may refer to a compressed or molded block of a solid material. The tablet may be placed into the crucible. An advantage is easy handling when loading the crucible.

It is to be understood that the features mentioned above and those yet to be explained below may be used not only in the combination respectively indicated, but also in other combinations or separately, without departing from the scope of the present disclosure.

BRIEF DESCRIPTION OF THE DRAWINGS

The disclosure will now be described with reference to the drawings wherein.

DESCRIPTION OF EXEMPLARY EMBODIMENTS

Figure 1:
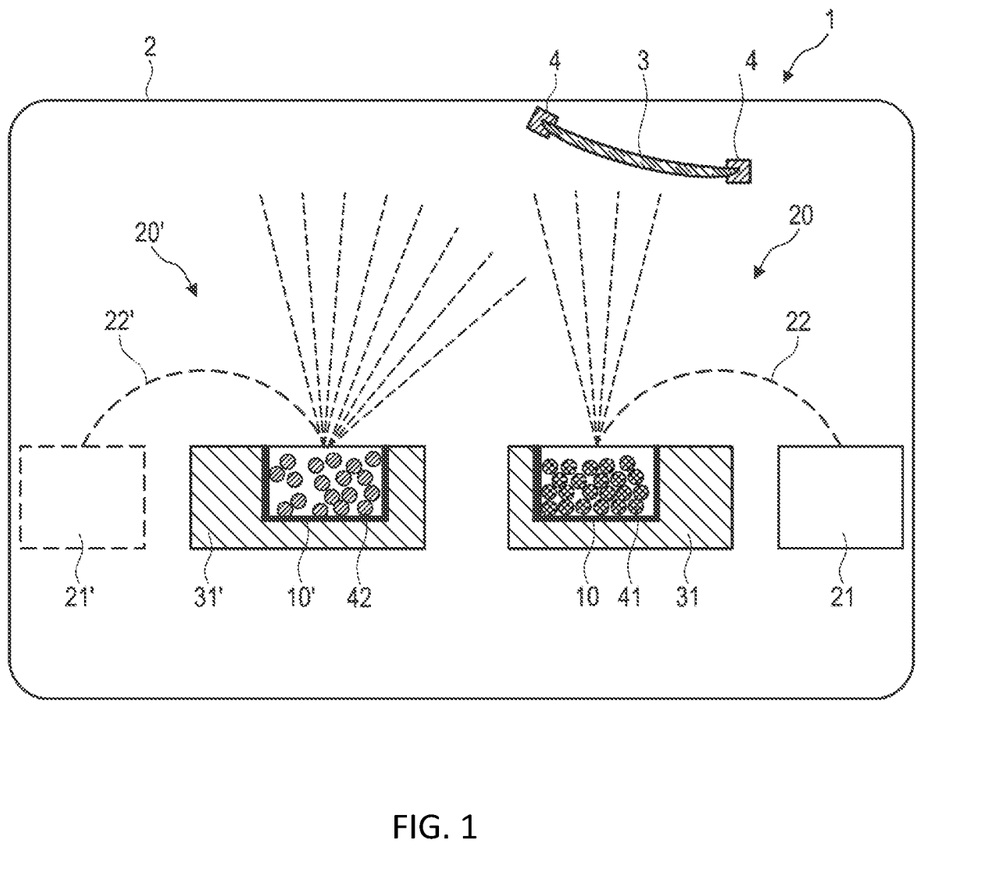
FIG. 1 shows a schematic diagram of an embodiment of conventional system for physical vapor deposition with different crucibles filled with different evaporation materials.

FIG. 1 shows a conventional physical vapor deposition system 1, in particular for coating an optical surface such as a spectacle lens. The physical vapor deposition system 1 comprises a vacuum chamber 2. Inside the vacuum chamber, a crucible 10 and evaporation unit 20 are provided for evaporating and depositing an evaporation material 41 onto a substrate 3 in a holder 4. The substrate can be an optical element such as a spectacle lens. It shall be understood that a plurality of lenses holders may be provided and that a plurality of lenses may be coated in parallel. In the embodiment shown in FIG. 1, the crucible 10 is inserted into a crucible holder 11 in an evaporation position.

For physical vapor deposition of materials, electron beam evaporation may be used. An electron beam 22 from a source 21 can be used to evaporate an evaporation material 41, i.e., the material to be evaporated, in the crucible 10. In electron-beam physical vapor deposition the material to be deposited is heated by electron bombardment in high vacuum and is transported by diffusion to be deposited by condensation on the (cooler) work piece or substrate 3. However, other heating methods may be used as well. For example, in pulsed laser deposition a high-power laser may ablate material from the crucible into a vapor.

Important parameters in physical vapor deposition are the vacuum pressure in the vacuum chamber during the deposition process, the scanning pattern used by the electron beam (i.e., repetitively guiding the electron beam over the evaporation material in the crucible) and the power of the electron beam. The pattern and power influence the homogeneity over the surface of the material. In existing vacuum deposition systems, there may be very limited possibilities to alter the pattern and power variation. A fixed pattern may be set stat scans over the area of the crucible in a predetermined manner. It would be desirable to provide a wider variety of coatings despite such boundary conditions of. The evaporation rate $\Phi_e$ from the crucible depends on the process parameters vacuum chamber pressure $P_h$ and Temperature T as well as the material parameters saturation vapor pressure $P_e$ and molar mass M of the used material:

$$\Phi_e = \frac{a_e N_A (P_E - P_h)}{(2\pi MRT)^{\frac{1}{2}}}$$

wherein $\alpha_e$ is a coefficient 0 . . . 1, $N_A$ denotes the Avogadro constant, and R denotes the universal or molar gas constant. The evaporation rate from the crucible 10 determines the deposition rate on the substrate 3.

In certain applications, it may be desirable to provide a coating comprising different material components or constituents. Different material components can be evaporated in parallel from different evaporation sources. Each evaporation source comprises a crucible with one material component that can be heated separately to achieve a desired composition for the coating. Referring again to FIG. 1, in the conventional physical vapor deposition system, a second crucible 10' and second evaporation unit 20' for evaporating and depositing a second evaporation material 42 are thus provided. The second crucible 10' is placed in a second holder 11' in a second evaporation position. The second evaporation unit 20' may comprise a second electron source 21' that provides a second electron beam 22' on the second evaporation material 42 in the second crucible 10'. The first evaporation material 41 evaporated from the (first) crucible 20 and the second evaporation material 42 evaporated from the second crucible 20' may thus form a desired coating composition on the substrate 3. The (first) evaporation unit 20 and the second evaporation unit 20' have to be controlled carefully.

However, there may be existing vapor deposition systems where it is not possible to install a second evaporation unit 20' and second crucible 10'. Hence, rather substantial modifications may be required in existing vacuum deposition equipment. Moreover, the control of the first and second evaporation units 20, 20' would have be adjusted carefully, thereby increasing the system complexity.

Figure 2:
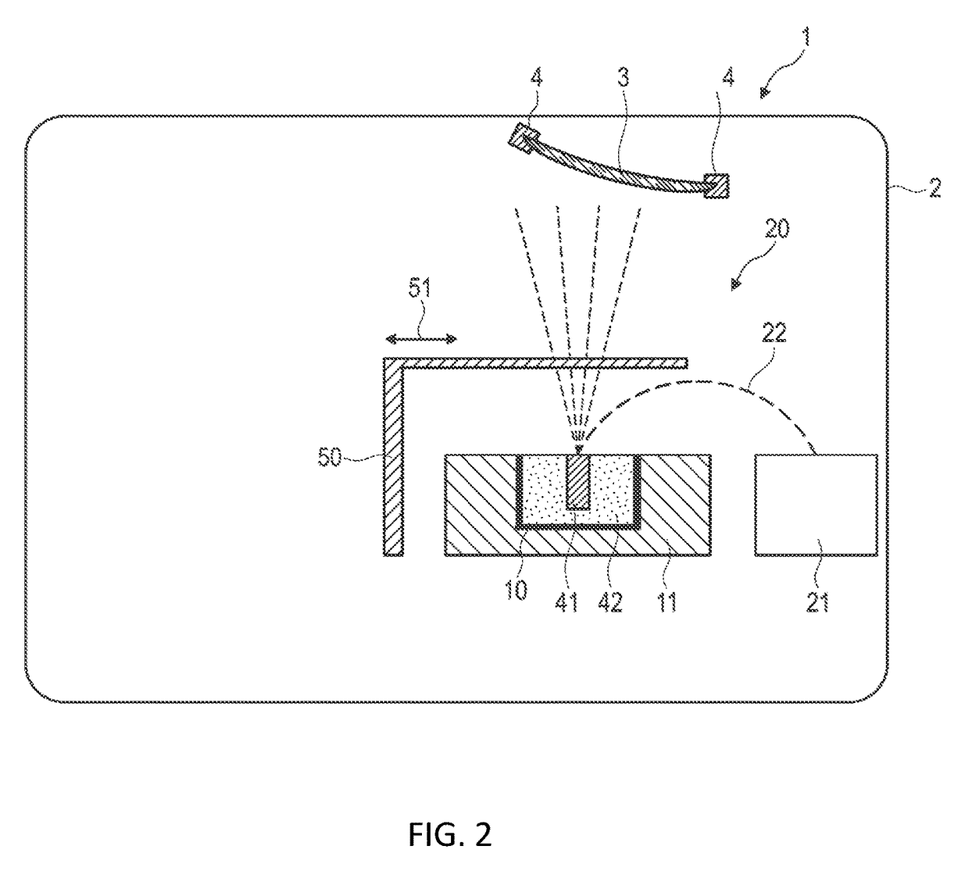
FIG. 2 shows a schematic diagram of an exemplary embodiment of a physical vapor deposition system according to an aspect of the present disclosure.

FIG. 2 shows a schematic diagram of an embodiment of exemplary physical vapor deposition system according to an aspect of the present disclosure. Similar components are denoted by the same reference numerals as in FIG. 1. However, instead of providing different crucibles for the first and second evaporation material 41, 42, it is suggested specifically adapt the composition of the content of a single individual crucible 10 such that evaporation of the first and second evaporation material 41, 42 from the crucible provides a desired coating composition on a surface 3 to be coated. Accordingly, the crucible comprises the first evaporation material 41 and the second evaporation material 42. The first evaporation material 41 has a first vapor pressure and the second evaporation material 42 has a second vapor pressure different from the first vapor pressure. A ratio of the first evaporation material 41 and the second evaporation material 42 in the crucible 10 is specifically adapted to counterbalance the difference in vapor pressure between the first and the second evaporation material. Hence, even though the first and second evaporation material have different vapor pressures, a desired stoichiometry or stoichiometric ratio can be achieved such that a desired composition of the coating can be achieved. Hence, it is not necessary to evaporate the first and second evaporation material with different heating or electron or laser beam power. This simplifies the control. Moreover, existing vapor deposition equipment can be used without substantial modification, neither for the arrangement of crucibles nor for adapting control and/or beam steering of an evaporation unit. In particular, the proposed solution enables the deposition of mixed coatings with an evaporation unit having a single heating source. Moreover, the homogeneity of a coating may be improved compared to a solution with separate crucibles, where different material components may be received from substantially different angular directions. Hence, inhomogeneities may be reduced in a simple, yet effective manner.

The inventors recognized that even though difference of the molar masses of the first and second evaporation material may be present, the differences can generally be neglected since they are generally at least an order of magnitude lower than differences in vapor pressure between the first and second evaporation material and may thus be neglected to simplify the procedure.

FIGS. 3A to 3F illustrate several exemplary cross-sectional views of configurations of a crucible 10 comprising a first evaporation material 41 and a second evaporation material 42.

Figure 3A:
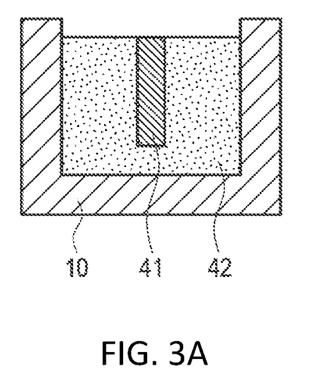
FIGS. 3A to 3F show several exemplary configurations of a crucible comprising a first evaporation material and a second evaporation material having different vapor pressures.

In the exemplary embodiment shown in FIG. 3A, the first evaporation material 41 having a higher vapor pressure is provided as a solid body in form of a rod. The second evaporation material 42 is provided as a granulate surrounding the solid body of the first evaporation material. For example, the first evaporation material 41 may be a road of Ag that stands upright in a granulate of $SiO_2$. A ratio of an exposed surface of the first evaporation material and an exposed surface of the second evaporation material at a surface of the crucible 10 is adapted to counterbalance the difference in vapor pressure between the first evaporation material 41 and the second evaporation material 42. The solid body 41 may be arranged in the crucible 10 without touching a bottom of the crucible. As explained above, this may avoid high currents through the solid body towards a (grounded) bottom of the crucible, which would induce additional heating of the solid body in a potentially unstable manner. Thereby, the process stability can be further improved.

Figure 3B:
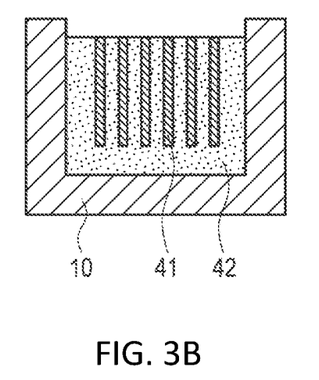

In the exemplary embodiment of FIG. 3B, a plurality of wires of the first evaporation material 41 are provided. The second evaporation material 42 is provided as a granulate surrounding the plurality of wires of the first evaporation material. The arrangement of the plurality of wires in the crucible 10 can be adapted to meet the condition:

$$\frac{\sum \text{ of all surface areas of the first evaporation material}}{\text{surface area of the second evaporation material}} = \frac{\text{vapor pressure of the second evaporation material}}{\text{vapor pressure of the first evaporation material}}$$

Thereby, the ratio of exposed surfaces can be approximated efficiently.

Figure 3C:
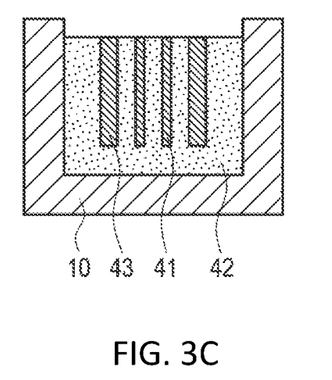

FIG. 3C shows an exemplary embodiment, wherein a first evaporation material 41, a second evaporation material 42 and a third evaporation material 43 are provided. The third evaporation material 43 has a third vapor pressure lower than the first vapor pressure of the first evaporation material 41 but lower than the second evaporation pressure of the second evaporation material 42. The ratios of the first, second and third evaporation materials are adapted accordingly to counterbalance the difference in vapor pressure between the first, second and third evaporation material.

Figure 3D:
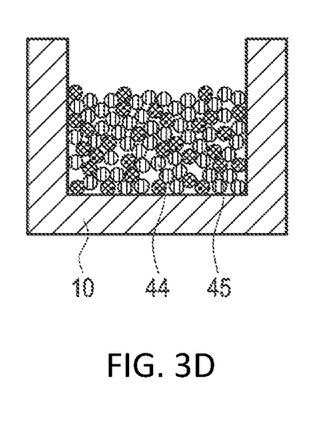

FIG. 3D shows an exemplary embodiment, wherein the first evaporation material 44 and the second evaporation material 45 having a lower vapor pressure than the first evaporation material are provided as a granulate mixture in the crucible 10. A ratio of the first evaporation material and the second evaporation material in the granulate mixture in the crucible are adapted to counterbalance the difference in vapor pressure between the first and the second evaporation material. Nonetheless, the exemplary embodiments of FIGS. 3A to 3C are generally typical. They may provide an even more homogeneous coating, since there is a risk that a higher vapor pressure in a granulate mixture evaporates with such a high rate that the first evaporation material may deplete in a granulate mixture. Hence, it is typical to provide the first evaporation material as a solid body such as a rod or wire. Moreover, in view that the material in the crucible is usually not evaporated entirely, the recycling of remaining material is facilitated if the first evaporation material is provided as a solid body. This may also reduce manufacturing costs.

Figure 3E:
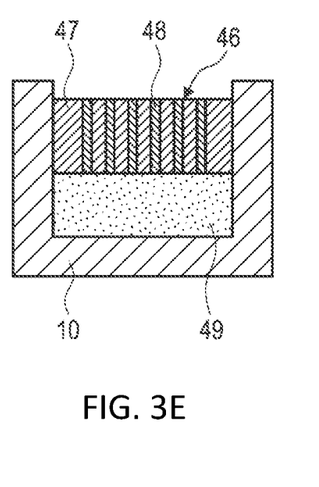

FIG. 3E shows an exemplary embodiment, wherein the first evaporation material 47 and the second evaporation material 48 having a lower vapor pressure than the first evaporation material are provided as tablet 46 in the crucible. A ratio of the first evaporation material and the second evaporation material in the tablet is adapted to counterbalance the difference in vapor pressure between the first and the second evaporation material. Such a tablet allows easy handling. Nonetheless, the exemplary embodiments of FIG. 3A to 3C may provide other advantages over this solution. The different vapor pressures in a tablet may lead to stress that may result in outbursts of one of the evaporation materials, thereby jeopardizing the homogeneity of the coating. Moreover, recycling of remaining evaporation materials from a tablet may be difficult. Optionally, a granulate layer 49 may be provided underneath the tablet 46 such that it does not touch a bottom of the crucible 10.

Figure 3F:
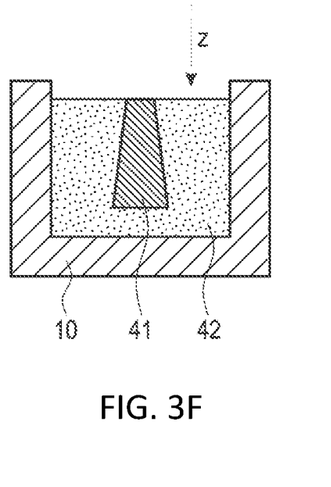

FIG. 3F shows an exemplary embodiment, wherein a cross-sectional area of the solid body of the first evaporation material 41 may varies in a direction perpendicular to a height-direction of the crucible. The height direction is indicated by an arrow z in FIG. 3F. Thereby, a ratio of an exposed surface of the first evaporation material 41 and an exposed surface of the second evaporation material at a surface of the crucible varies as the first and second evaporation material are evaporated. Hence, varying concentration profiles can be generated over the thickness of a coating to be deposited on a target in an easy matter. No depth-dependent adaptation of the electron or laser beam power for the evaporation processes or careful adjustment of beam powers for different crucibles may be required.

Figure 4:
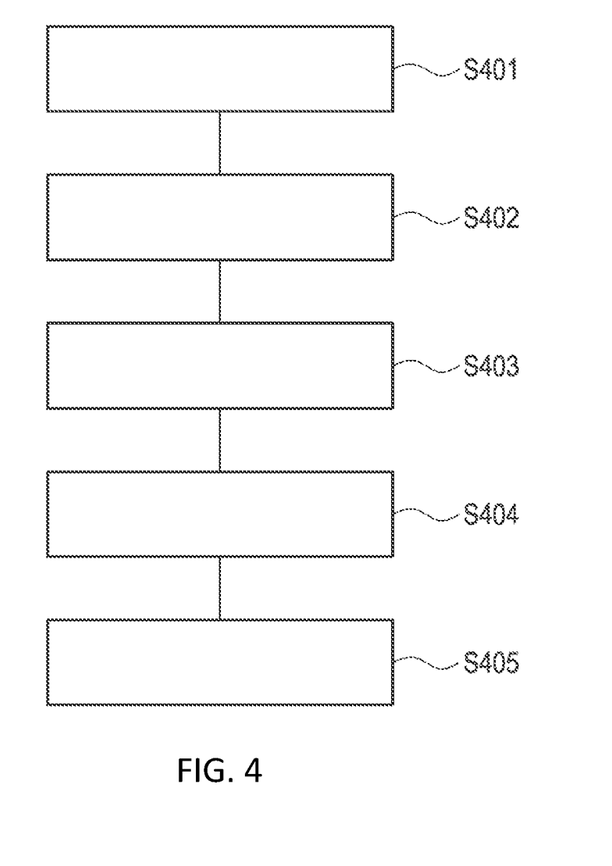
FIG. 4 shows a flow-chart of a method a method for physical vapor deposition, in particular for coating an optical surface such as a spectacle lens.

FIG. 4 shows a flow-chart of a method for physical vapor deposition, in particular for coating an optical surface such as a spectacle lens. In a first step S401, a crucible comprising a first evaporation material and a second evaporation material is provided. The first evaporation material has a first vapor pressure and the second evaporation material has a second vapor pressure different from the first vapor pressure. The content of the crucible is specifically adapted such that a ratio of the first evaporation material and the second evaporation material in the crucible is adapted to counterbalance the difference in vapor pressure between the first and the second evaporation material.

In step S402, a vacuum can be provided by evacuating the vacuum chamber in which the crucible is placed in an evaporation position. An optional step S403 denotes a soaking phase. The material in the crucible may be pre-heated in the soaking phase with a closed shutter. The shutter blocks the path from the crucible to the element to be coated. In step S404, the shutter may be opened. An exemplary optional shutter 50 is illustrated in FIG. 2. The shutter may retract as indicated by arrow 51 and free the path from the crucible 10 to the substrate 3 to be coated.

In step S405, the first evaporation material and the second evaporation material are concurrently evaporated from the same crucible. This step can be referred to as a coating phase.

Advantageously, a short soaking and/or a short coating phase are used. Thereby, the formation of droplets of the first evaporation material which may run off, e.g., from the solid body of the first evaporation material into the granulate of the second evaporation material, can be reduced. A soaking phase and/or coating phase may have a duration of at least one of less than 15 seconds, less than 10 seconds, or less than 5 seconds. Such parameter have proven advantageous because a melting of the solid body and flow of droplets from the solid body into the granulate can be avoided or at least reduced. Hence, the method may work particularly well for thin coating layers of e.g., less than 15 nm thickness.

While the invention has been illustrated and described in detail in the drawings and foregoing description, such illustration and description are to be considered illustrative or exemplary and not restrictive; the invention is not limited to the disclosed exemplary embodiments. Other variations to the disclosed exemplary embodiments can be understood and effected by those skilled in the art in practicing the claimed invention, from a study of the drawings, the disclosure, and the appended claims.

In the claims, the word "comprising" does not exclude other elements or steps, and the indefinite article "a" or "an" does not exclude a plurality. A single element or other unit may fulfill the functions of several items recited in the claims. The mere fact that certain measures are recited in mutually different dependent claims does not indicate that a combination of these measures cannot be used to advantage.

Any reference signs in the claims should not be construed as limiting the scope.

The invention claimed is:

1. A method of physical vapor deposition for coating an optical surface of a spectacle lens, the method comprising:
   providing a crucible containing a first evaporation material and a second evaporation material,
   wherein the first evaporation material has a first vapor pressure and the second evaporation material has a second vapor pressure different from the first vapor pressure; and
   concurrent evaporation of the first evaporation material and the second evaporation material from a same crucible,
   wherein a ratio of an exposed surface of the first evaporation material and an exposed surface of the second evaporation material at a surface of the crucible is adapted to counterbalance a difference in vapor pressure between the first and the second evaporation material.

2. The method according to claim 1, wherein the ratio of the exposed surfaces of the first and second evaporation material is inversely proportional to a ratio to vapor pressures of the first and second evaporation materials.

3. The method according to claim 1, wherein the first evaporation material and the second evaporation material are evaporated using an electron beam or laser beam, wherein the electron beam or laser beam is set to the same power for evaporation of the first and second material.

4. The method according to claim 1, wherein the first evaporation material having a higher vapor pressure is provided as a solid body, and wherein the second evaporation material having a lower vapor pressure than the first evaporation material is provided as a granulate surrounding the solid body of the first evaporation material.

5. The method according to claim 4, wherein the first evaporation material is provided as at least one of a rod, a wire, or sheet.

6. The method according to claim 5, wherein a plurality of rods, wires, or sheets of the first evaporation material is provided.

7. The method according to claim 4, wherein the solid body of the first evaporation material stands upright in the granulate of the second evaporation material.

8. The method according to claim 4, wherein the solid body is arranged in the crucible without touching a bottom of the crucible.

9. The method according to claim 4, wherein a cross-sectional area of the solid body varies in a direction perpendicular to a height-direction of the crucible.

10. The method according to claim 1, wherein the first evaporation material and the second evaporation material having a lower vapor pressure than the first evaporation material are provided as a granulate mixture in the crucible, and wherein a ratio of the first evaporation material and the second evaporation material in the granulate mixture in the crucible is adapted to counterbalance the difference in vapor pressure between the first and the second evaporation material.

11. The method according to claim 1, wherein the first evaporation material and the second evaporation material having the lower vapor pressure than the first evaporation material are provided as a tablet in the crucible, and wherein the ratio of the first evaporation material and the second evaporation material in the tablet is adapted to counterbalance the difference in vapor pressure between the first and the second evaporation material.

12. A physical vapor deposition system for coating an optical surface of a spectacle lens, the system comprising:
   a vacuum chamber;
   a crucible comprising a first evaporation material and a second evaporation material, wherein the first evaporation material has a first vapor pressure and the second evaporation material has a second vapor pressure different from the first vapor pressure, and wherein a ratio of an exposed surface of the first evaporation material and an exposed surface of the second evaporation material in the crucible is adapted to counterbalance a difference in vapor pressure between the first and the second evaporation material; and
   an evaporation unit configured to concurrently evaporate the first evaporation material and the second evaporation material from the same crucible.

* * * * *